(12) United States Patent
Mizuno (10) Patent No.: US 6,807,122 B2
(45) Date of Patent: Oct. 19, 2004

(54) SEMICONDUCTOR MEMORY DEVICE REQUIRING REFRESH

(75) Inventor: Hiroyuki Mizuno, Kokubunji (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/410,196

(22) Filed: Apr. 10, 2003

(65) Prior Publication Data

US 2003/0214871 A1 Nov. 20, 2003

Related U.S. Application Data

(63) Continuation of application No. 09/979,010, filed on Nov. 14, 2001, now Pat. No. 6,560,154.

(51) Int. Cl.$^7$ .................................................. G11C 7/00
(52) U.S. Cl. ........................................ 365/222; 257/300
(58) Field of Search .............................. 365/222, 227, 365/228, 229

(56) References Cited

U.S. PATENT DOCUMENTS

| | | | |
|---|---|---|---|
| 4,907,199 A | | 3/1990 | Dosaka et al. |
| 5,740,118 A | * | 4/1998 | Sato et al. .................. 365/222 |
| 5,894,446 A | * | 4/1999 | Itou ........................... 365/222 |
| 5,926,051 A | | 7/1999 | Funitani |
| 5,970,009 A | | 10/1999 | Hoenigschmid |
| 6,256,252 B1 | | 7/2001 | Arimoto |
| 6,414,894 B2 | * | 7/2002 | Ooishi et al. ............... 365/222 |

FOREIGN PATENT DOCUMENTS

| | | |
|---|---|---|
| JP | 60-045997 | 3/1985 |
| JP | 05-314765 | 11/1993 |
| JP | 08-241587 | 9/1996 |
| JP | 08-241590 | 9/1996 |

OTHER PUBLICATIONS

16777216–Word×4–bit Dynamic Random Access Memory, Hitachi, p. 249.
Hitachi IC Memory No. 3, Mar. 1996, pp. 131–149.
IEDM Tech. Dig. 1997, "PLED–Planar Localised Electron Devices" IEDM 97–179–97–182.

* cited by examiner

Primary Examiner—David Nelms
Assistant Examiner—Thao P. Le
(74) Attorney, Agent, or Firm—Antonelli, Terry, Stout & Kraus, LLP (57) ABSTRACT

A semiconductor memory device is provided including a memory having memory cells and circuit blocks, a power switching circuit and a refresh control apparatus. In a first operation state, the refresh control apparatus supplies power to the memory using the power switching circuit to refresh the memory cells. In a second operation state, the refresh control apparatus turns off the power supply to at least one circuit block using the power switching circuit. Another operation state is also provided in which round transition between the first and second operation states is repeated multiple times. Accordingly, power consumption is reduced, especially for semiconductor memory devices that use memory elements in which a lengthy period is required for the refresh operation. As a result, it is possible to decrease the overall electric power of the semiconductor device.

14 Claims, 4 Drawing Sheets

SEMICONDUCTOR MEMORY DEVICE REQUIRING REFRESH

CROSS-REFERENCE TO RELATED APPLICATIONS

This application is a Continuation application of U.S. patent application Ser. No. 09/979,010, filed Nov. 14, 2001 now U.S. Pat. No. 6,560,154 the entire disclosure of which is hereby incorporated by reference.

TECHNICAL FIELD

The present invention relates to a semiconductor memory device. In particular, the present invention relates to a semiconductor memory device having also a low electric power characteristic.

BACKGROUND ART

Figure 3:
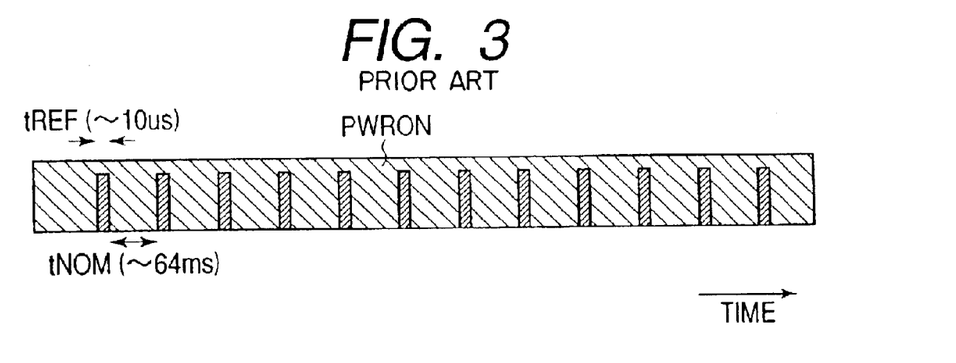
FIG. 3 is a diagram illustrating a relation between refresh and power supply control performed in a conventional device.

In general, as regards a dynamic memory, which stores information by charge accumulated in a capacitor, it is necessary to perform refresh operation in order to hold information in the memory. During the refresh operation, power is supplied to the memory, and data in the memory is read and rewritten at intervals of about 64 ms. FIG. 3 shows a time relation of power-on. A horizontal axis indicates time; tREF represents a period during which refresh operation is being performed; tNOM represents a period during which the refresh operation is not performed; and PWRPM represents a period during which power supply is being turned on. Such an example is shown in, for example, "Hitachi IC Memory Data Book 2", Hitachi, Ltd., pp. 239, September 1997.

On the other hand, as regards an EEPROM and a flash memory, which stores information by electrons accumulated in a floating gate in general, information in the memory is held for about 10 years even if power is not supplied to the memory. Such an example is shown in, for example, "Hitachi IC Memory Data Book 3", Hitachi, Ltd., pp. 147, September 1996.

DISCLOSURE OF INVENTION

At present, a memory cell, which uses a data storage concept of a dynamic memory (DRAM: Dynamic Random Access Memory), is widely studied. There is a high possibility that a memory cell, which is capable of storing information even if a period for refresh operation is much longer (for example, 10 seconds) than the present refresh interval of about 64 ms, is developed.

In this case, in particular, the DRAM has a disadvantage of power consumption during a standby state.

Figure 4:
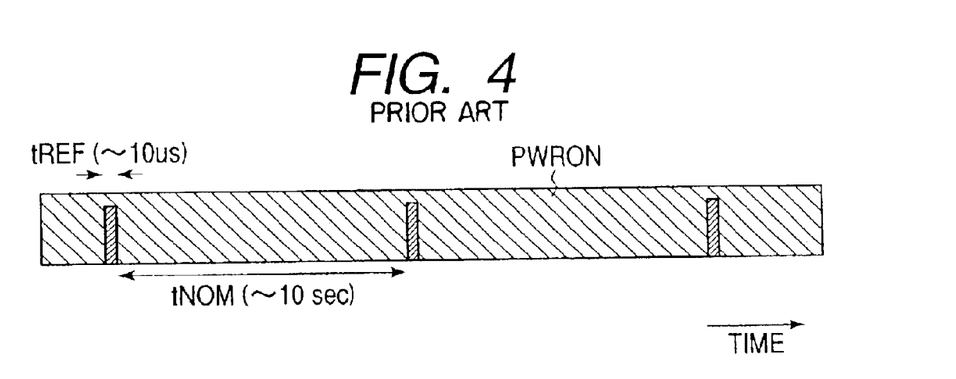
FIG. 4 is a diagram illustrating a relation between refresh and power supply control, which is expected when a period for refresh operation of the conventional device is long.
Figure 5:
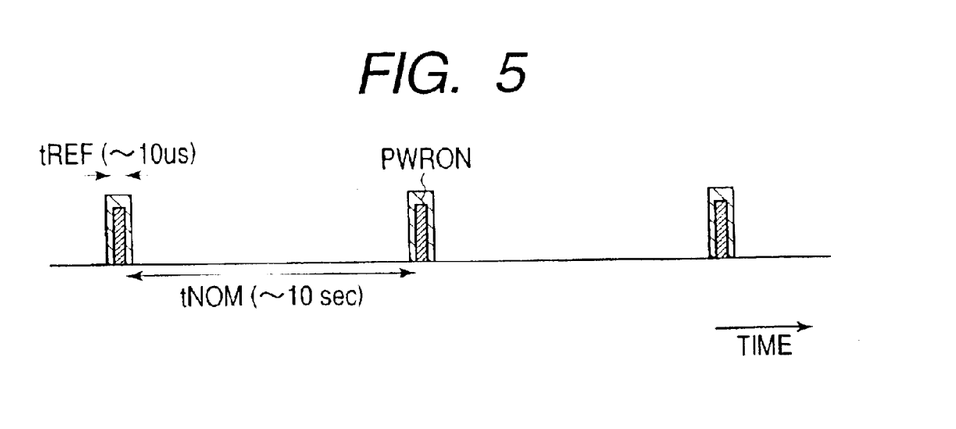
FIG. 5 is a diagram illustrating intermittent power control type refresh according to the present invention.

FIGS. 3 through 5 are diagrams illustrating relations between refresh and power supply control when various memory elements are used. FIG. 3 illustrates a relation found in the conventional DRAM; FIG. 4 illustrates a relation found when a memory element, of which a period for refresh operation is longer than the present refresh interval of about 64 ms, is used; and FIG. 5 illustrates a relation according to the present invention. By the way, in these diagrams, tREF represents a period for refreshing memory; tNOM represents a standby period; and PWRON represents a period during which power supply is being turned on.

To be more specific, for example, if a dynamic memory of which a period for refresh operation is 10 seconds could be realized, and if the conventional technique is used, the following operation is required to hold information accumulated in the dynamic memory: supplying power to the dynamic memory; and performing refresh operation once every 10 seconds. FIG. 4 shows a time relation of power-on of this example. A horizontal axis is time, and representations in FIG. 4 are the same as those shown in FIG. 3. The refresh operation requires a large amount of electric power (hereinafter referred to as refresh electric power). However, due to sub-threshold leakage current, electric current flowing into a constant current supply circuit, and the like, only supplying power to a circuit causes the circuit to consume a small amount of electric power (hereinafter referred to as standby power consumption).

As regards the DRAM of which characteristics are illustrated in FIG. 3, a ratio of the period tREF to the period tNOM is 1/6400. Because of it, the standby power consumption described above is little remarkable. However, on the other hand, in the method shown in FIG. 4, a ratio of the period tREF to the period tNOM is 1/1000000. Therefore, even if standby power consumption is 1/1000000 of refresh electric power, almost the same amount of electric power as the refresh electric power will be consumed in total as the standby power consumption.

In addition, also in the case of the flash memory, promoting miniaturization in a manufacture process, etc. causes film thickness of an oxide layer enclosing the floating gate to become thin, resulting in short data retention time. For example, if the data retention time becomes one year, and if the conventional technique is used, the flash memory will be used on the assumption that the data retention time of the flash memory is one year. This will cause degradation of a lifetime of the product.

Main means used to solve the above-mentioned problems will be described below.

The present invention relates to a semiconductor memory device comprising: a memory including a plurality of memory cells and a plurality of circuit blocks; a power switching means; and a refresh control apparatus; wherein: said semiconductor memory device has a first operation state and a second operation state; in the first operation state, the refresh control apparatus supplies power to the memory using the power switching means to refresh the memory cells; in the second operation state, the refresh control apparatus turns off the power supply to at least one circuit block of the memory using the power switching means; and an operation state, in which round transition between the first operation state and the second operation state is repeated multiple times, is provided.

What is important in the present invention is that in the second operation state, the power supply to at least one circuit block of the memory is turned off.

Moreover, although the round transition between the first operation state and the second operation state is repeated multiple times, the number of times is realistically considered as five times or more.

Furthermore, it is needless to say that, what is called, the DRAM, the flash memory, or other storage elements can be used as the memory cell according to present invention. A main point of the inventive concept of the present invention is a large reduction of the standby power consumption of the memory element. Therefore, as described above, if a memory cell having a characteristic that the period for refresh operation of the memory cell is much longer than that of the refresh interval (for example, for one second or more) is used, the present invention is extremely useful. If a memory cell, of which a period for refresh operation is longer than the above (for example, 10 seconds or more), is used, greater effect will be produced.

More specifically, the present invention is useful when using a memory cell having a characteristic that an interval between the first storage holding operation and the second storage holding operation of the memory cell is one second or more. Furthermore, the present invention is useful when using a memory cell having a characteristic that an interval between the first storage holding operation and the second storage holding operation of the memory cell is 10 seconds or more.

It is to be noted that the present invention is basically applied to a period over which only data holding is performed. In other words, as a matter of course, during operation such as read or write of the memory, etc., the power supply is not turned off. This can be understood judging from the point of the present invention, that is to say, the reduction of standby power consumption.

For the purpose of reducing the standby power consumption, there are a plurality of methods for turning off power supply of a desire element. Embodiments of these various methods will be described as below.

BEST MODES FOR CARRYING OUT THE INVENTION

Before specifically explaining various modes of the present invention, main modes of the present invention will be listed as below.

Firstly, a first mode relates to a semiconductor memory device according to the present invention, characterized in that said memory comprises a power supply circuit that generates power supply required when reading from or writing to the memory cell; and a circuit block, of which power supply is turned off in a circuit in the memory by a power switching means in the second operation state, is the power supply circuit.

Secondly, a second mode relates to a semiconductor memory device according to the present invention, characterized in that said refresh control apparatus comprises a timer; and in the second operation state, a part of power supply of the refresh control apparatus's circuit except the timer is also turned off.

Thirdly, a third mode relates to a semiconductor memory device according to the present invention, characterized in that said memory cell is a dynamic memory cell that stores information by charge accumulated in a capacitor; and a period for refresh operation of the memory cell is one second or more.

Fourthly, a fourth mode relates to a semiconductor memory device according to the third mode, characterized in that said memory cell comprises a path for a first charge carrier; a node for storing charge that generates an electric field where conductivity of the path is changed; and a barrier structure through which a second charge carrier passes in response to given voltage so that the second electron carrier is stored in the node; and said barrier structure presents an energy band profile comprising a first barrier component having a first barrier height and a first width; and a second barrier component having a second barrier height higher than the first barrier height, and a second width narrower than the first width.

In this mode, a memory element used for this mode has advantages of so-called DRAM level high speed, and flash memory level non-volatility of the memory. In addition to it, it is possible to realize a semiconductor memory device, of which power consumption is low, according to the present invention.

Fifthly, a fifth mode relates to a semiconductor memory device according to the third mode, characterized in that said memory cell is a flash memory cell that stores information in an electron stored in a floating gate.

In this mode, it is possible to provide a semiconductor storage device characterized by low power consumption and long life.

Sixthly, a sixth mode relates to a semiconductor memory device according to the first mode, characterized in that said memory cell is a memory cell having the following characteristics: a period for refresh operation of the memory cell is longer than that of an interval for refresh operation; and the period for refresh operation of the memory cell is one second or more.

Next, various modes of the present invention will be specifically exemplified.

Figure 1:
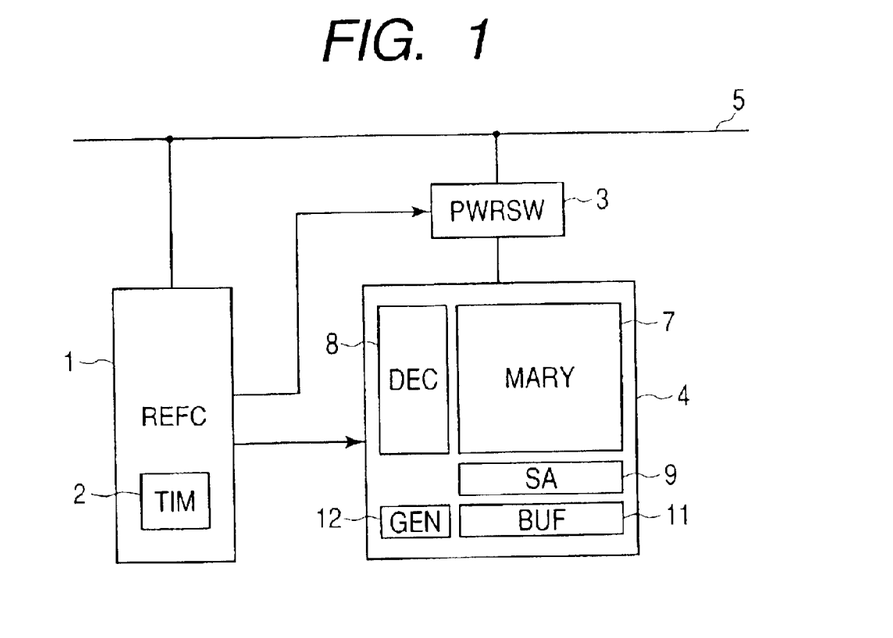
FIG. 1 is a diagram illustrating an embodiment that shows a basic configuration of the present invention.

FIG. 1 is a configuration diagram illustrating an example of a semiconductor memory device according to the present invention. This example comprises the following components. To be more specific, REFC represents a refresh control circuit (1); TIM represents a timer (2) used for its measurement of a period for refresh operation; PWRSW represents a power switching means (3); MEM represents a memory circuit (4) having a period for refresh operation that is sufficiently longer than a period for refresh operation of the currently used DRAM; and PWR represents a power line (5). In this case, a period of refresh operation is 10 seconds as an example. As a specific configuration, the memory circuit (4) comprises the following: a memory cell array MARY (7), which is made up of many memory cells; a decoder DEC (8) that selects a part of the memory cells; a sense amplifier SA (9) that amplifies information on the memory cell; an interface BUF (11) between the memory circuit MEM (10) and outside; and a power supply circuit GEN (12). It is to be noted that use of general materials is sufficient to realize the specific configuration of this memory circuit (4).

The refresh control circuit 1 refreshes the memory circuit 4 in response to time measured by the timer 2. More specifically, when time required for refresh comes, in the first place, power is supplied to the memory circuit 4 using the power switching means 3. After that, the memory circuit 4 is refreshed. Finally, each power supply in the memory circuit 4 is turned off using the power switching means 3 again. However, the power supply is connected in such a manner that power is supplied from the power switching means 3 to each of element areas such as the memory cell array (7), the decoder (8), the sense amplifier (9), the interface (11), and the power supply circuit GEN (12), which are included in the memory circuit 4. FIG. 1 shows the connection of the power supply excluding this point.

FIG. 5 shows a time relation of power-on. FIG. 5 shows the same time relation as those in FIGS. 3 and 4. In this manner, in this example, turning off electric power of a circuit during a period of tNOM permits a ratio of standby power consumption to all power consumption to be reduced to nearly zero.

Figure 2:
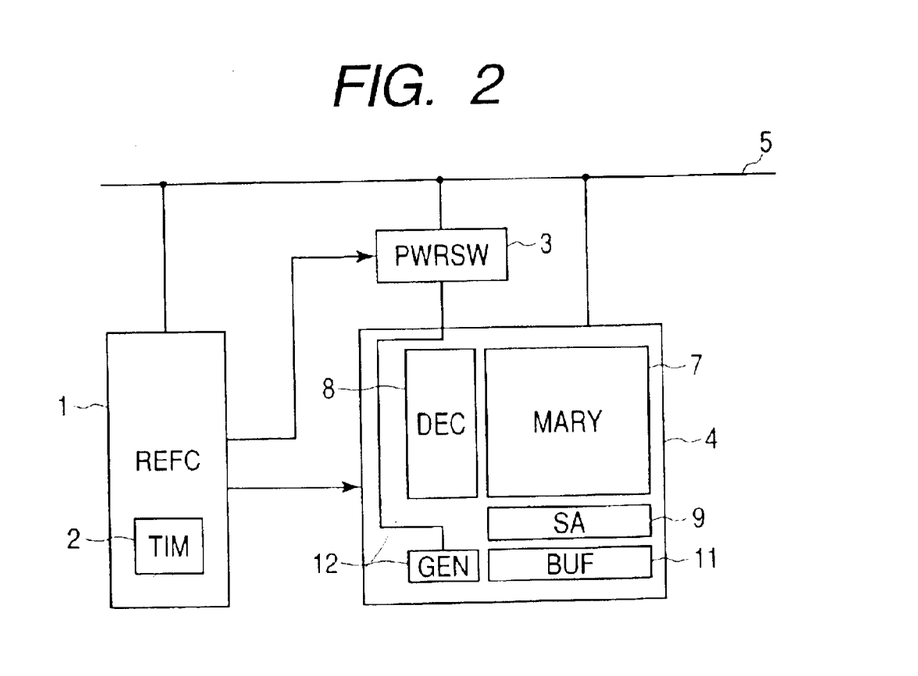
FIG. 2 is a diagram illustrating another embodiment according to the present invention.

FIG. 2 is a diagram illustrating a second embodiment according to the present invention. If a memory cell, which will be used, is such that holding contents stored in the memory cell becomes difficult when power supply to the whole memory circuit is completely turned off, it is necessary to supply power to the decoder and the sense amplifier. The second embodiment is an example that is capable of coping with this case.

A difference with the example shown in FIG. 1 is that the power supply controlled by the power switching means 3 is limited to the power supply circuit 12 in the memory circuit 4.

A circuit, which consumes highest standby power consumption, is often the power supply circuit 3 that includes so-called analog circuits such as constant current supply circuit. Turning off power supply of the power supply circuit 12 (GEN) permits standby power consumption to be reduced efficiently, whereby same effects as those produced by the example shown in FIG. 1 can be obtained.

In the present invention, for the purpose of reducing the standby power consumption, it is not necessarily required to limit a circuit, of which power supply should be turned off, to the power supply circuit. Even if power supply to the other circuit portion is turned off, it is possible to reduce power consumption in this portion. However, if the basic concept of the present invention is applied, limiting it to a circuit, which can reduce more standby power consumption by turning off power supply, is more efficient. In this sense, as described above, turning off the power supply of the power supply circuit 12 in the memory circuit 4 is more effective.

Additionally, although power is constantly supplied to the refresh control circuit 1 in FIG. 1, it does not relate to the main points of the present invention in particular. This means that it is possible to use the other configurations arbitrarily. For example, there is also the following method: power is supplied only to the timer 2; and power of the refresh control circuit 1 is supplied according to an instruction by the timer 2. In short, the power supply is controlled so that during periods other than the period for refresh operation, power is supplied to only circuits such as the timer 2, of which power supply cannot be turned off, and so that power to the other circuits is turned off wherever practicable.

In the above description, memory operation such as read and write is not described. However, a problem between these is operation of general semiconductor storage devices. In the above-mentioned definitions (that is to say, tREF is a period over which refresh operation is performed, and tNOM is a period over which the refresh operation is not performed), periods for operation such as read and write are included in tNOM. However, it applies to a period over which basically only data hold operation is performed. As described above, of course, in the present invention, power supply is not turned off during operation including read and write. The period, over which basically only data hold operation is performed, represents a period that is called, for example, a standby state, a sleep state, or a hibernation state.

In addition, in order to perform operation shown in FIG. 5, power-on steps, which are based on the assumption that transition from tNOM to tREF occurs, are not particularly limited. In the present invention, power-on control such that refresh operation is normally performed is only required.

Figure 6:
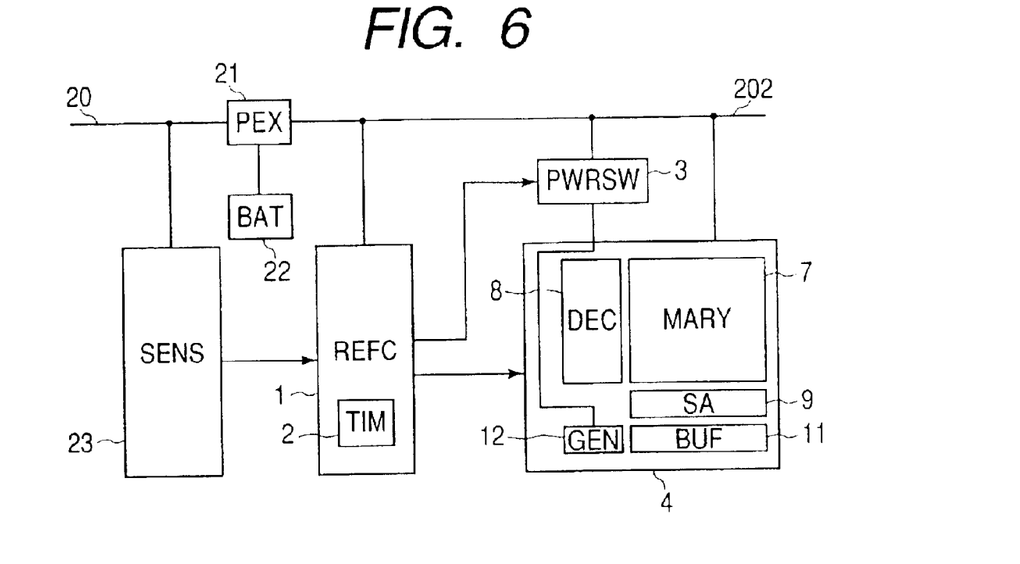
FIG. 6 is a configuration diagram illustrating another embodiment according to the present invention.

An example shown in FIG. 6 is an embodiment in which how to use the example in FIG. 2 is described more specifically. During normal operation that performs read and write of the memory circuit 4, power is always supplied to the power line (PWR: 20). Reference numeral 21 is a power supply selector (PEX); 22 is a battery (BAT: 22); 23 is a voltage detecting circuit (SENS); and 202 is a second power line.

When power is supplied to the power line 20, the power line 202 is supplied with power from the power line 20. In addition, when the power supply from the power line is turned off, the power line 2 is supplied with power from the battery 22.

On the other hand, the voltage detecting circuit 23 performs the following: monitoring potential of the power line 20; detecting that the power supply of the power line 20 has been turned off; and then instructing the refresh control circuit 1 to perform periodical refresh operation. The refresh operation at this time is similar to that shown in FIG. 5.

Figure 7:
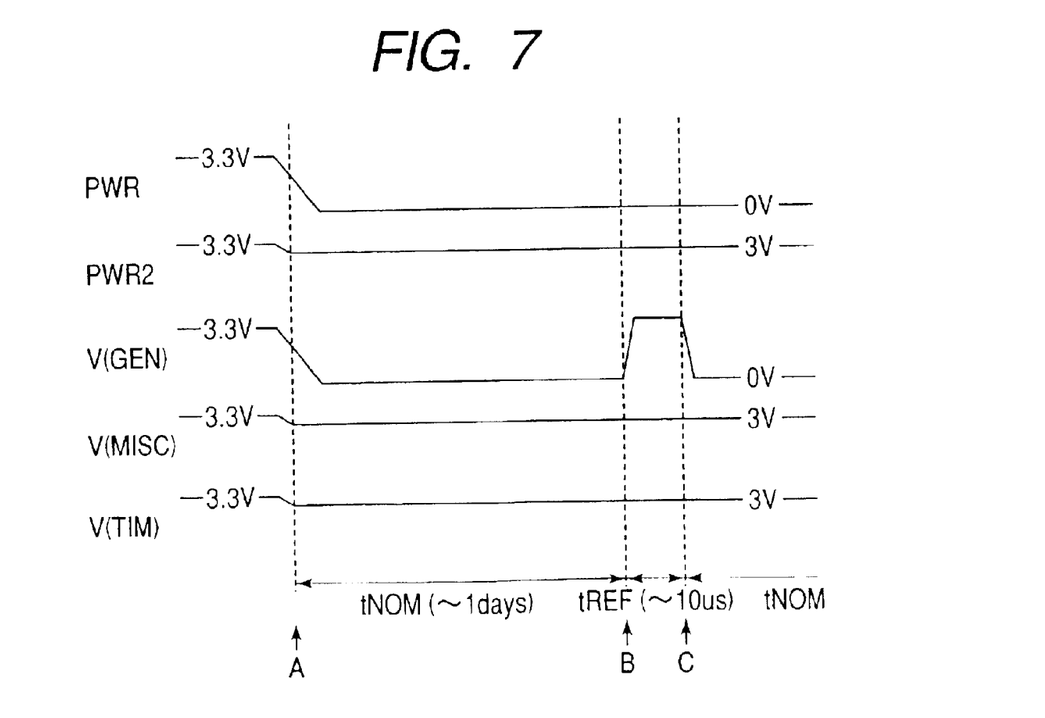
FIG. 7 is an example of a time chart in an embodiment shown in FIG. 6.

FIG. 7 illustrates an example of a specific operation waveform of the embodiment shown in FIG. 6. This example is based on the assumption that a power-supply voltage of the power line is 3.3 V, and that a voltage of the battery 22 is 3 V. V (GEN) represents voltage of power supply that is fed to the power supply circuit. V (MISC) represents voltage of power supply that is fed to circuits in the memory circuit other than the power supply circuit. V(TIM) represents voltage of power supply that is fed to the timer 2. Additionally, PWR and PWR2 represent voltage at each power line.

When the power supply of the power line 20 is turned off at a point A, the power supply to the power line 2 is switched by the power supply selector (21) PEX. That is to say, the power supply selector (21) PEX switches its power-supply destination. As a result, power is supplied from the battery 22BAT to the power line 2. Accordingly, potential of the power line 2 changes from 3.3 V to 3 V. The voltage detecting circuit 23 detects that the power supply of this power line has been turned off. The refresh control circuit 1 is notified of its result. In response to the result, the refresh control circuit 1 turns off the power supply of the power supply circuit using the power switching means 3 (SW), and then starts a refreshing cycle as shown in FIG. 5. In other words, when refresh operation starts like a point B shown in FIG. 7, the power supply to the power supply circuit is restarted for the refresh operation. After that, when the refresh operation is completed, the power supply to the power supply circuit is turned off again (C point shown in FIG. 7).

Such operation permits data existing in the memory circuit 4 to be held even if the power supply of the power line is turned off in the standby state, the hibernation state, or the like. In addition, it is possible to reduce electric power consumption in this state to a minimum level that is required for holding data by means of intermittent power control using the refresh control circuit 1, the power switching means 3, etc.

If the memory circuit and the method for controlling the memory circuit according to the present invention is used for a small personal computer, it is possible to reduce electric power consumption in the standby state, and in the hibernation state. Therefore, a battery lifetime of the personal computer can be lengthened. Moreover, because data in the memory circuit is held even in the standby state, the hibernation state, etc., it is possible to shorten returning time from any one of those states to the operation state.

If the period for refresh operation according to the present invention as shown in FIG. 5 continues for a long time (for example, five hours), information on the memory circuit 4 is stored in the hard disk on standby before the refresh operation shown in FIG. 5 is also stopped. In this case, the data existing in the memory circuit 4 is erased. Therefore, when returning to the operation state, it is necessary to load the data, which has been stored in the hard disk, into the memory circuit 4. It takes a long time to return. However, it such a long time (for example, five hours) is not spent, the returning time does not often cause a problem in particular. The control produces an advantage that it is possible to reduce electric power consumption required for refreshing.

Furthermore, if a back-up medium such as a hard disk is provided, it is possible to store the data, which exists in the memory circuit 4, in the hard disk on standby when electric power for continuing refresh operation, which is performed by the intermittent power control according to the present invention, is stopped. For example, concerning the refresh operation by the intermittent power control, a battery lifetime is checked at each refresh operation. In that case, if it is judged that only electric power, which is equivalent to an electric power level required for storing the data existing in the memory circuit 4 in the hard disk on standby, remains in the battery, the refresh operation by means of the intermittent power control is stopped, and then the data existing in the memory circuit 4 is stored in the hard disk on standby. This control method enables us to completely prevent the data existing in the memory circuit 4 from being erased.

In the above-mentioned embodiment, the medium is not particularly limited to the hard disk. If a medium can store data inside the medium, the medium can be applied even if the medium is not supplied with power. For example, a flash memory is applicable.

In addition, in the above-mentioned embodiment, the timer 2 is used to measure a period for refresh operation. However, the measurement is not particularly limited to this method. The following method can also be used: instead of the timer 2, equipping with a circuit that can monitor characteristics of the memory cell in the memory circuit; detecting that the data saved in the memory cell will be erased; and determining the period for refresh operation described above. Using an adaptive refresh circuit like this enables optimization of the period for refresh operation. Because of it, refresh electric power by means of the intermittent power control can be further reduced.

Generally, there are two kinds of methods for refreshing a dynamic memory. One method is distracted refreshing. In this method, one-time refreshing refreshes only one row address, and all row addresses are refreshed in a predetermined period for refresh operation. The other method is concentrated refreshing. In this method, all row addresses are refreshed continuously in a certain period of time, and this is performed during a predetermined period for refresh operation.

On the other hand, because electrical charge and discharge of capacity of the power supply are required for turning on/off power supply, comparatively large electric power is consumed. Therefore, decreasing the number of times the power supply is turned on/off as many as possible permits the electric power consumption to be reduced.

According to these facts, in the embodiment described above, by adopting the concentrated refreshing, the number of times the power supply is turned on/off can be reduced. Therefore, the refresh electric power by means of the intermittent power control according to the present invention can be reduced.

The memory circuit 4 described above is not limited to a dynamic memory. As described above, a memory having a relatively long period for refresh operation is applicable. A configuration of the memory cell itself does not matter. As a configuration of the memory circuit 4, for example, the above-mentioned flash memory having data retention time of only about one year is applicable. Even if the flash memory having short data retention time like this is used, by using, for example, a basic configuration according to the present invention as shown in FIG. 6, a flash memory system having data retention time of 10 years can be built, with only small capacity internal power supply, that is, a battery (BAT) equipped. In this manner, according to the present invention, it is possible to provide a semiconductor storage device, of which data retention time is long, and of which power consumption is low.

Figure 8:
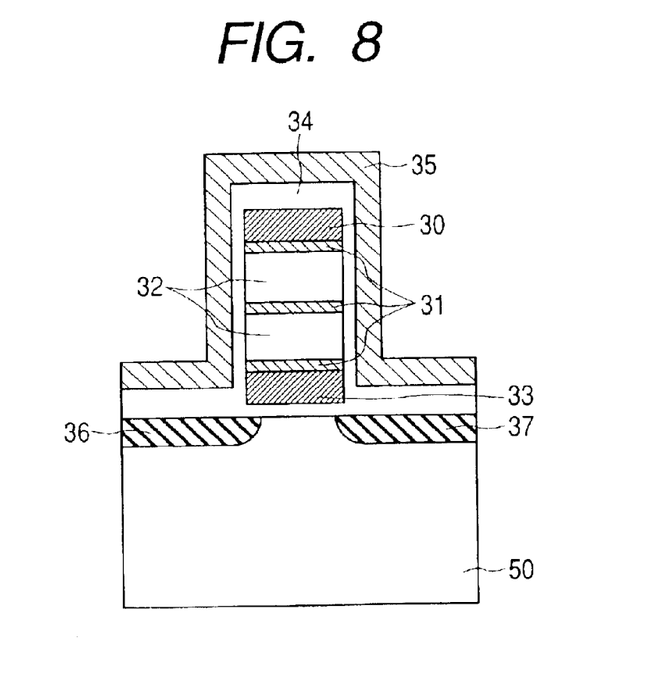
FIG. 8 is a sectional view illustrating an example of a memory cell that constitutes a memory array shown in FIG. 1.
Figure 9:
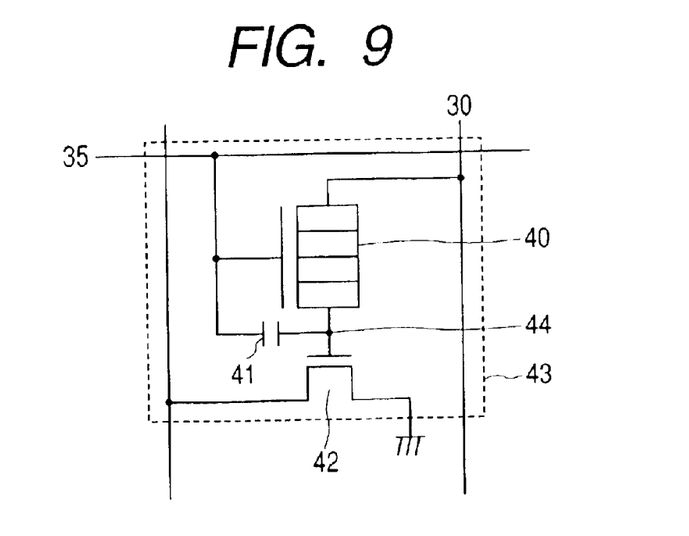
FIG. 9 is a circuit diagram illustrating an example of the memory cell shown in FIG. 8.

FIGS. 8 and 9 shows an example of the memory circuit 4, which uses another example as a memory cell. This is an example, in which the memory circuit 4 described above is configured using a semiconductor device that is abbreviated as a so-called PLED (Planar Localized Electron Device) element. The circuit like this is designated as PLED memory.

This PLED element is a semiconductor device, of which stored information becomes low leakage; to be more specific, charge accumulated in a storage node becomes low leakage. This can be said to be a semiconductor device characterized in that said semiconductor device has a layered structure comprising a insulated layer and a semiconductor layer; said layered structure is placed between an electrode structure and an charge storage node; and by means of barrier height control for a carrier possessed by the layered structure, electric current, which flows between the electrode structure and the charge storage node, is controlled.

The layered structure is considered that it is possible to switch its operation mode between an operation mode having a high barrier height for the carrier and an operation mode having a lower barrier height as compared with this, and that this switching function permits the electric current, which flows between the electrode structure and the electron storage node, to be controlled. By the way, this PLED itself is disclosed in, for example, Japanese Patent Application Laid-Open No. Hei 10-200001, or "PLED-Planer Localized Electron Devices", IEDM Tech. Dig., pp.179–182, 1997, etc.

In this mode, a memory element used for this mode has advantages of so-called DRAM level high speed, and flash memory level non-volatility of the memory. It is not necessary to keep the power supply constantly turned on for memory holding. In addition, although refreshing the memory is required, it is made practical use in about once a day, or once a week, for example. Therefore, for example, the following becomes possible: keeping only the power supply of the timer in the semiconductor memory device turned on constantly; and turning on the power supply of the memory during the period for refresh operation, which permits the power supply of the memory to be turned off during the other periods. Thus, it is possible to reduce the power consumption of the semiconductor device to an extremely low level as compared with the levels achieved by the conventional semiconductor memory devices or the levels by means of the conventional driving methods.

FIG. 8 shows a sectional view of an example of the memory cell like this. FIG. 9 shows a circuit diagram of the memory cell. In FIG. 8, reference numeral 40 represents a semiconductor substrate; 30 represents a bit line; 31 represents an insulated barrier layer; 32 represents intrinsic poly-silicon; 33 represents a charge storage node; 34 represents an oxide layer; 35 represents a word line; 35 and 36 represent sense lines; and 37 represents a ground electrode. The sense line 36 and the grounding conductor 37 depend on an impurity implanted region formed on the semiconductor substrate 40. These correspond to a source and a drain in a general insulated-gate field-effect-transistor device. Therefore, a manufacturing method similar to that of the general insulated-gate field-effect-transistor device is sufficient. By the way, in FIG. 8, in order to make understanding of an outline of this semiconductor storage device easy, the semiconductor substrate 50 and a laminated area, which is laminated on the semiconductor substrate 50, are illustrated so that their directions intersect. To be more specific, in an actual configuration, a direction of a line connecting the sense line 36 with the grounding conductor 37 intersects a direction to which the word line 35 extends.

In an insulated-gate field-effect-transistor (typified by MOS transistors) structure, in which a source, a drain, and a gate correspond to the ground electrode 37, the sense line 36, and the charge storage node 33 respectively, a PLED element having a layered structure is formed on a top surface of the charge storage node 33 corresponding to the gate; and the PLED element comprises the charge storage node 33, the tunnel layer 30, the intrinsic poly-silicon, and the bit line. Moreover, the word line 35, which controls electric current flowing to the terminals BIT at both ends of the PLED element and to the electron storage node 33, is additionally formed so that the word line 35 covers the PLED element.

If a memory element is configured using this PLED element, an example as described below is proposed. To be more specific, it is a semiconductor storage device, wherein said memory element comprises: a path for a first charge carrier; a node for storing charge that generates an electric field where conductivity of the path is changed; and a barrier structure through which a second charge carrier moves in response to given voltage so that the second charge carrier is stored in the node; and said barrier structure has an energy band profile comprising: a first barrier component having a first barrier height and a first width; and a second barrier component having a second barrier height higher than the first barrier height, and a second width narrower than the first width.

FIG. 9 shows a circuit diagram of the memory cell illustrated in FIG. 8. A portion 43, which is enclosed with a dotted line in FIG. 9, indicates the memory cell. On a memory cell array portion, many memory cells like this are arrayed, for example, in a matrix form. In FIG. 8, reference numeral 40 shows the PLED element schematically. The specific structure of this element is shown in FIG. 8. A reference numeral 41 is parasitic overlap capacitance between the charge storage node 33 and the word line 35 shown in FIG. 8, and saves charge as data in the capacity. As regards the writing to the memory, high potential is applied to the word line 35. Potential in response to the data to be written to the bit line 30 is applied to. This causes the PLED element 40 to enter an ON state. As a result, charge is transferred from the bit line 30 to the charge storage node 33.

During read operation, potential is applied to the word line 35, and then an insulated-gate field-effect transistor 42 (the MOS transistor is a typical example), which is indicated by the reference numeral 42 (MOS1), is turned on or off in response to the charge accumulated in the capacitor (CAP) 41 to read the data through the sense line 36. By the way, the insulated-gate field-effect transistor 42 and the so-called PLED element are connected to each other via the node 44.

Moreover, it is needless to say that the example, which uses the PLED element, can use various configurations illustrated in FIG. 1, 2 or 6 described above.

In this manner, according to the present invention, it is possible to provide a semiconductor memory device, of which power consumption is low.

INDUSTRIAL APPLICABILITY

As described above, the present invention can provide a semiconductor memory device, of which power consumption is low. Furthermore, the present invention can provide a semiconductor storage device, of which power consumption is low.

What is claimed is:

1. A semiconductor memory device comprising:
   a memory comprising a plurality of memory cells and a plurality of circuit blocks;
   a power switch; and
   a refresh control apparatus, wherein:
   said semiconductor memory device has a first operation state and a second operation state;
   in the first operation state, the refresh control apparatus refreshes one or more of the memory cells;
   in the second operation state, the refresh control apparatus turns off the power supply to at least one circuit block of the memory using the power switch; and
   said semiconductor memory device has an operation state in which round transition between the first operation state and the second operation state is repeated multiple times.

2. A semiconductor memory device comprising:
   a memory including a plurality of memory cells and a plurality of circuit blocks;
   a power switch; and
   a refresh control apparatus including a timer,
   wherein said semiconductor memory device has a first operation state and a second operation state, the plurality of memory cells,
   wherein in the second operation state, a power supply of at least one circuit block of said memory is turned off by said power switch and a power supply of said refresh control apparatus except the timer is turned off, and
   wherein said semiconductor memory device can repeat transitions between the first operation state and the second operation state.

3. A semiconductor memory device according to claim 2, wherein the plurality of circuit blocks has a power supply circuit that generates power supply required for reading from or writing to the memory cell, and
   wherein the power supply of the power supply circuit is turned off by said power switch in the second operation state.

4. A semiconductor memory device according to claim 2,
wherein each of the plurality of the memory cells stores information by charge held in a capacitor, and
wherein a period for refresh operation of the plurality of memory cells is one second or more.

5. A semiconductor memory device according to claim 2,
wherein each of the plurality of memory cells is a flash memory cell that stores information in a charge held in a floating gate.

6. A semiconductor memory device according to claim 2,
wherein each of the plurality of the memory cells stores information by charge held in a capacitor, and
wherein a period for refresh operation of the plurality of memory cells is ten seconds or more.

7. A semiconductor memory device comprising:
a memory including a plurality of memory cells and a plurality of circuit blocks;
a first power line;
a power switch coupled between said memory arid said first power line; and
a refresh control apparatus,
wherein said semiconductor memory device has a normal state and a standby state and the standby state includes a first operation state and a second operation stale,
wherein a fist voltage is supplied to said first power line in the normal state,
wherein a second voltage is supplied to said first power line from a battery in the standby state,
wherein in the first operation state, said refresh control apparatus refreshes the plurality of memory cells,
wherein in the second operation state, the power supply of at least one circuit block of said memory is turned off by said power switch, and
wherein said refresh control apparatus performs a refresh operation which repeats transitions between the first operation state and the second operation state in the standby state.

8. A semiconductor memory device according to claim 7
wherein the first voltage is greater than the second voltage.

9. A semiconductor memory device according to claim 7, further comprising:
a power supply selector coupled to said first power line,
wherein said power supply selector selects the battery end supplies the second voltage to said first power line after said semiconductor memory device becomes in the standby state.

10. A semiconductor memory device according to claim 9, further comprising:
a second power line coupled to said power supply selector; and
a voltage detecting circuit coupled to said second power line,
wherein the first voltage is supplied to said second power line from a first a power source different from the battery, and
wherein said voltage detecting circuit detects that a power supply of said second power line from the first power source is turned off end then instructs said refresh control apparatus to perform the refresh operation.

11. A semiconductor device according to claim 7,
wherein said memory further includes a power supply circuit that generates power supply required for reading from or writing to the memory cell, and
wherein a power supply of the power supply circuit is turned off by said power switch in the second operation state.

12. A semiconductor memory device according to claim 6,
wherein each of the plurality of the memory cells stores information by charge held in a capacitor, and
wherein a period of the second operation state is one second or more.

13. A semiconductor memory device according to claim 7,
wherein each of the plurality of memory cells is a flash memory cell that stores information in a charge held in a floating gate.

14. A semiconductor memory device according to claim 7,
wherein each of the plurality of the memory cells stores information by charge held in a capacitor, and
wherein a period of the second operation state of the plurality of memory cells is ten seconds or more.

* * * * *